(12) United States Patent
Shimanouchi

(10) Patent No.: US 7,120,840 B1
(45) Date of Patent: Oct. 10, 2006

(54) METHOD AND SYSTEM FOR IMPROVED ATE TIMING CALIBRATION AT A DEVICE UNDER TEST

(75) Inventor: Masashi Shimanouchi, Sunnyvale, CA (US)

(73) Assignee: Credence Systems Corporation, Milpitas, CA (US)

( * ) Notice: Subject to any disclaimer, the term of this patent is extended or adjusted under 35 U.S.C. 154(b) by 406 days.

(21) Appl. No.: 10/773,698

(22) Filed: Feb. 6, 2004

(51) Int. Cl.
  *G06K 5/04* (2006.01)
  *G06F 11/00* (2006.01)
  *G01D 18/00* (2006.01)
  *G01R 31/28* (2006.01)

(52) U.S. Cl. .................. 714/700; 714/741; 702/89
(58) Field of Classification Search .............. None
  See application file for complete search history.

(56) References Cited

U.S. PATENT DOCUMENTS

| | | | |
|---|---|---|---|
| 4,594,677 A * | 6/1986 | Barlow ..................... | 703/15 |
| 5,784,299 A * | 7/1998 | Evers et al. ................ | 702/85 |
| 6,587,811 B1 * | 7/2003 | Schleifer et al. ........... | 702/176 |
| 2004/0034838 A1 * | 2/2004 | Liau ........................... | 716/4 |

\* cited by examiner

Primary Examiner—Christine T. Tu

(57) ABSTRACT

A method for improved ATE (automatic test equipment) timing calibration at a DUT (device under test). The method includes step of accessing a DUT component using an ATE component and performing physical calibration on a first portion of signal pathways coupling the ATE component to the DUT component. A simulation based calibration is performed on a second portion of signal pathways coupling the ATE component to the DUT component. The physical calibration results are combined with simulation based calibration results to calibrate timing propagation delay between the ATE component and the DUT component.

32 Claims, 25 Drawing Sheets

METHOD AND SYSTEM FOR IMPROVED ATE TIMING CALIBRATION AT A DEVICE UNDER TEST

FIELD OF THE INVENTION

The field of the present invention relates to test methodology for high performance digital integrated circuit systems.

BACKGROUND OF THE INVENTION

Modern digital integrated circuit devices are achieving very high data processing speeds. For example, many widely used serial communication integrated circuit devices routinely operate at data I/O rates of multi-gigabits per second (Gbps). Such ever increasing data rates have placed ever increasing demands on the automatic test equipment (ATE) used to test the devices. As operating speeds have increased, higher and higher ATE test timing accuracy is required. For example, to properly test I/O signals of a multi-gigabit signal, the ATE must reliably and accurately place test strobe edges for the signal with pico-second accuracy.

Prior art conventional ATE methods are loosing their ability to keep pace with the edge placement accuracy requirements of high performance integrated circuit devices. One reason for the deficiency of the prior art is the fact that the conventional timing calibration error mechanisms do not accurately apply to high speed applications. Assumptions about the error mechanisms for a conventional device-under-test (DUT) are increasingly inaccurate as signal data rates increase into the mult-Gbps range.

For example, the basic prior art deskew calibration method is acceptably accurate to calibrate the same speed grade ATE pins at the driver/comparator junctions, if data dependent timing error/jitter (DDJ) is negligibly small. DDJ is, however, one of the major error sources in multi-Gbps testing, and therefore needs to be properly accounted for, and calibrated out, for higher timing accuracy. For DDJ calibration, at-speed calibration measurement is essentially required, and therefore the prior art calibration methods, which necessitate calibration measurements at low speed, are not applicable.

Another problem is the fact that as signal data rates increase into the multi-Gbps range, the conventional prior art practice of modeling the ATE to DUT signals paths as simple transmission lines is no longer valid. At the multi-Gbps speeds, a number of different error sources quickly become significant and can no longer be ignored. Such error sources include, for example, DDJ timing error, pin-to-pin skew, and calibration errors at the DUT. These problems render the prior art testing methodology insufficient for modern high speed, high performance integrated circuit devices.

Thus what is required is a solution that can accurately and reliably test modern high speed integrated circuit devices. The required solution should be capable of accounting for error sources such as DDJ, pin-to-pin skew, and calibration errors in a testing and verification process for a high performance DUT. Another problem is the fact that as signal data rates increase into the multi-Gbps range, the conventional prior art practice of modeling the ATE to DUT signals paths as simple transmission lines with a few lumped parasitic capacitors and inductors is no longer valid.

SUMMARY OF THE INVENTION

Embodiments of the present invention comprise a method and system for improved ATE timing calibration at a device under test that can accurately and reliably test modern high speed integrated circuit devices. Embodiments of the present invention are capable of accounting for error sources such as DDJ, pin-to-pin skew, and calibration errors in a testing and verification process for a high performance DUT.

In one embodiment, the present invention is implemented as a method for improved ATE (automatic test equipment) timing calibration at a DUT (device under test). The method includes step of accessing a DUT component using an ATE component and performing physical calibration on a first portion of signal pathways coupling the ATE component to the DUT component. A simulation based calibration is performed on a second portion of signal pathways coupling the ATE component to the DUT component. The physical calibration results are combined with simulation based calibration results to calibrate timing propagation delay between the ATE component and the DUT component.

In this manner, the physical calibration results combined with the simulation based calibration results provide a solution that can accurately and reliably test modern high speed integrated circuit devices. Modern simulation techniques are capable of accounting for error sources such as DDJ, pin-to-pin skew, and calibration errors in a testing and verification process for a high performance DUT in a way that is not possible using traditional physical calibration techniques alone. Since modern simulation techniques (e.g., once the simulation's accuracy is validated) are used for modeling the ATE to DUT signals paths, accurate timing propagation delay calibration can be performed on DUT components operating in the multi-Gbps range.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Figure 1:
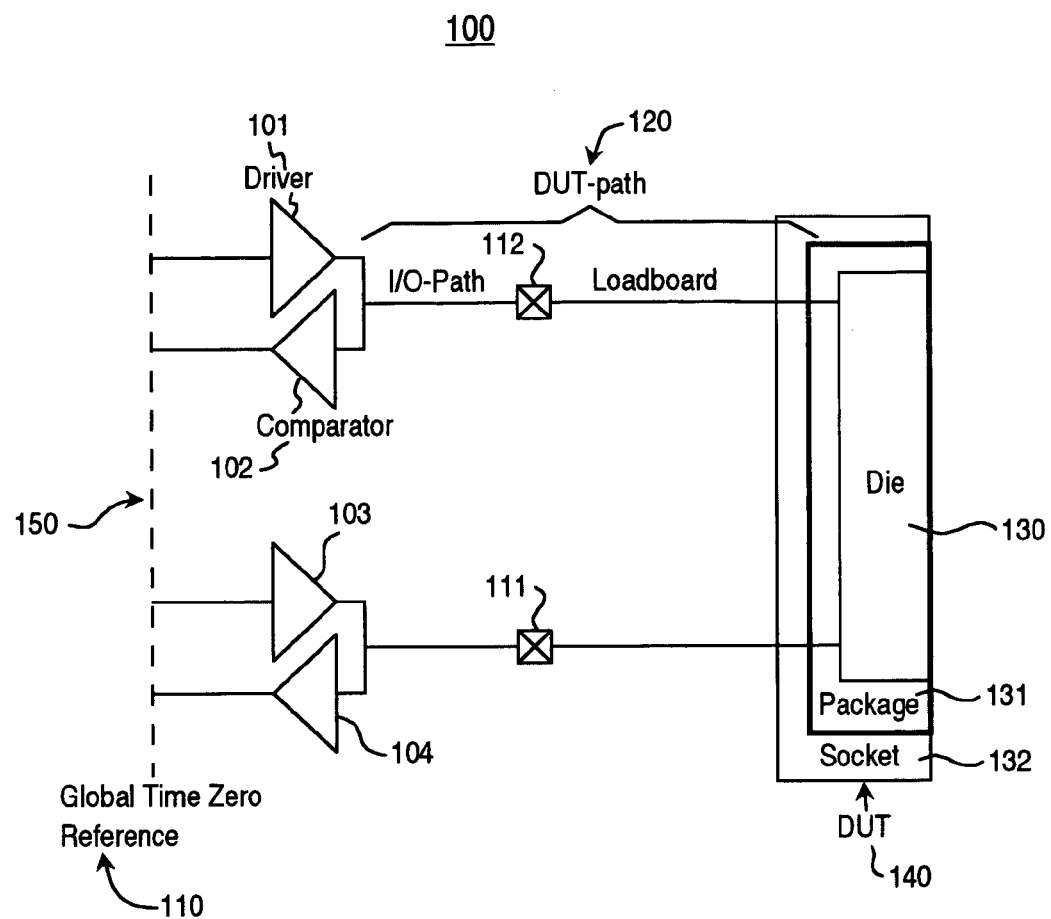
FIG. 1 shows a diagram depicting ATE timing paths involved in calibration in accordance with one embodiment of the present invention.

Embodiments of the present invention comprise a method and system for improved ATE timing calibration at a device under test. Embodiments of the present invention are well-suited to the ever-increasing data rates of high speed integrated circuit components that require increasingly higher test timing accuracy. Embodiments of the present invention greatly improve ATE edge placement accuracy in comparison to traditional timing calibration methods. Embodiments of the present invention provide new calibration methods and systems that overcome calibration limitations such as, for example, data dependent jitter (DDJ), pin-to-pin skew, and calibration at the actual device under test. Embodiments of the present invention and their benefits are described in greater detail below Overview of Traditional Timing Calibration Schemes:

FIG. 1 shows a diagram 100 depicting ATE timing paths involved in calibration. As depicted in FIG. 1, a DUT (device under test) 140 is shown, comprising a die 130, a package 131, and a socket 132. Drivers 101 and 103 and comparators 102 and 104 comprise driver-comparator pairs for injecting signals into the DUT 140 and receiving signals from the DUT 140. Two I/O paths 111 and 112 are shown with their respective pogo contacts. The bracket 120 shows the DUT signal path (e.g., from the driver comparator pairs of the automatic test equipment to the DUT 140).

As known by those skilled in the art, conventional ATE methodologies test devices by generating stimuli to a DUT 140 using its drivers and evaluates the DUT output strobing and comparing the evaluated strobing against expected data. As illustrated in FIG. 1, a global time zero reference 150 is assumed somewhere in an ATE, and both drive-side data generation timing and compare-side data strobe timing are to be calibrated with respect to the global time zero reference.

Figure 2:
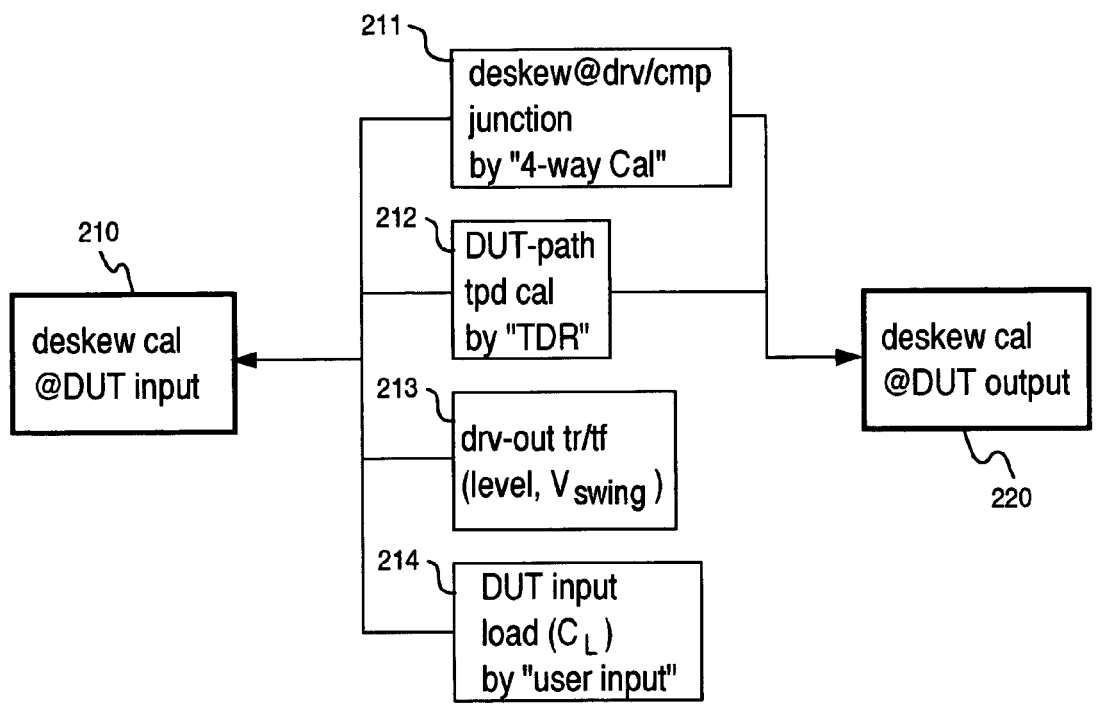
FIG. 2 shows a flow diagram depicting a traditional timing calibration methodology in accordance with one embodiment of the present invention.

FIG. 2 shows a flow diagram 200 depicting a traditional timing calibration methodology. The timing alignment (e.g., deskew calibration) of stimuli generation and data strobing at DUT I/O pins is performed as follows. At step 211, drive-side timing and compare-side timing of all the required pins for all the possible event types (drive high/low, strobe high/low etc.) are calibrated at the driver/comparator junctions of those pins. At step 212, the propagation delay between each driver/comparator junction and corresponding DUT socket pin is measured by TDR, and the calibration point is moved from each driver/comparator junction to the DUT pin. At step 213, the propagation delay is further adjusted for driveside considering driver output voltage swing. At step 214, propagation delay is further adjusted for DUT input capacitive loading effects. Then, the resulting calibration values (e.g., resulting from steps 211–214), each representing physically different signal paths (e.g. loadboard) or different signal integrity effects (e.g. DUT input loading) are algebraically added to provide the final deskew calibration value at both the DUT inputs, at step 210, and the DUT outputs 220.

It should be noted that, as used herein, driver output impedance is typically 50 ohm nominal for multi-Gbps devices, and comparator inputs are terminated by 50 ohm nominal even if they are not explicitly shown.

Figure 3:
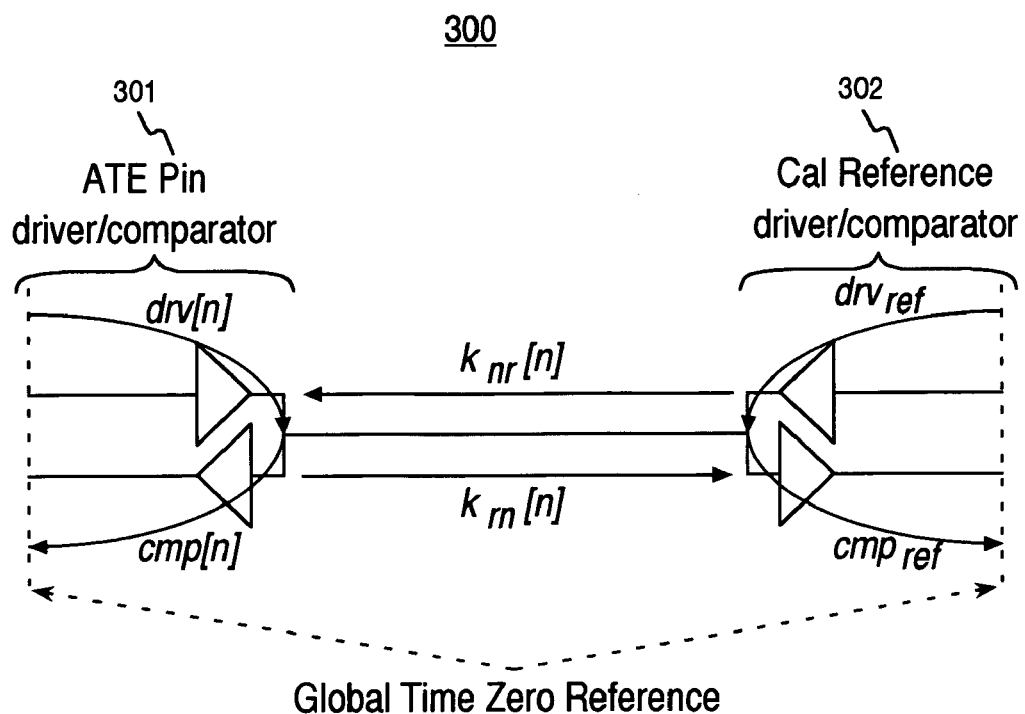
FIG. 3 shows a diagram depicting a four-way deskew calibration at an ATE pin driver/comparator junction and a calibration reference driver/comparator junction in accordance with one embodiment of the present invention.

4-Way Deskew Calibration:

FIG. 3 shows a diagram 300 depicting a four-way deskew calibration at an ATE pin driver/comparator junction 301 and a calibration reference driver/comparator junction 302. As depicted in FIG. 3, deskew calibration at each driver/comparator junction (e.g., junction 301) is based on the four independent calibration measurements as shown in FIG. 3. These measurements are expressed by (Eq1) through (Eq4) below:

$$\begin{cases} m1[n] = drv[n] + cmp[n] & \text{(Eq. 1)} \\ m2[n] = drv_{ref} + cmp_{ref} & \text{(Eq. 2)} \\ m3[n] = drv[n] + K_m[n] + cmp_{ref} & \text{(Eq. 3)} \\ m4[n] = drv_{ref} + K_{nr}[n] + cmp[n] & \text{(Eq. 4)} \end{cases}$$

In a typical implementation, each ATE has one dedicated reference driver/comparator 302 for the timing calibration use, and all the other pins are to be calibrated using the reference driver/comparator 302.

Using the calibration measurements results expressed by (E.1) through (Eq.4), the pin to pin timing variation with respect to the reference pin can be obtained as expressed by (Eq.5) for drive-side and as expressed by (Eq.7) for compareside, shown below. Assuming that the propagation delay between the driver/comparator junction of each tester pin 301 and the one of the reference pin 302 does not depend on signal propagation direction, the pin to pin timing variation can be completely obtained from the calibration measurements results as expressed by (Eq.6) and (Eq.8) shown below.

$$drv[n] - drv_{ref} = \frac{(m1[n] - m2[n]) + (m3[n] - m4[n])}{2} + \frac{K_{nr}[n] - K_m[n]}{2} \quad \text{(Eq. 5)}$$

$$= \frac{(m1[n] - m2[n]) + (m3[n] - m4[n])}{2} \quad \text{(Eq. 6)}$$

(if $K_{nr}[n] - K_m[n] = 0$)

$$cmp[n] - cmp_{ref} = \frac{(m1[n] - m2[n]) - (m3[n] - m4[n])}{2} - \frac{K_{nr}[n] - K_m[n]}{2} \quad \text{(Eq. 7)}$$

$$= \frac{(m1[n] - m2[n]) - (m3[n] - m4[n])}{2} \quad \text{(Eq. 8)}$$

(if $K_{nr}[n] - K_m[n] = 0$)

Figure 4:
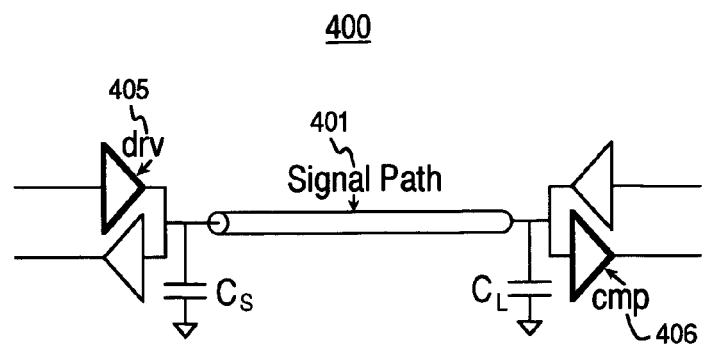
FIG. 4 shows a diagram depicting a primary cause of propagation delay dependency on signal propagation direction in accordance with one embodiment of the present invention.

The above assumption (e.g., regarding the propagation delay between the driver/comparator junction of each tester pin 301 and the one of the reference pin 302) is not valid in general, calibration error could occur. FIG. 4 shows a diagram 400 depicting a primary cause of propagation delay dependency on signal propagation direction. The primary cause is the different capacitive loading (e.g., depicted as $C_S$ and $C_L$) at both the driver end 405 and the comparator end 406, as illustrated in diagram 400. The different rise/fall time of, for example, a tester pin driver and a reference driver is secondary.

Figure 5:
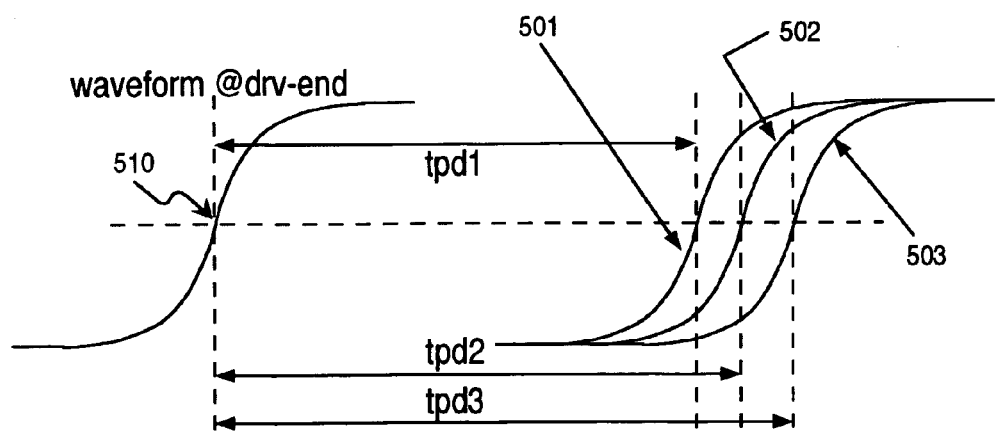
FIG. 5 shows a diagram depicting the manner in which a driver output edge speed is slowed in accordance with one embodiment of the present invention.

FIG. 5 shows a diagram 500 depicting the manner in which a driver output edge speed is slowed. The timing path delay 1 (e.g., tpd1) shows the delay of the signal 510 at the driver end to the comparator end signal 501 in an ideal situation (e.g. lossless signal path), tpd2 shows the delay to the comparator end signal 502 through a "lossy" signal path, and tpd3 shows the delay to the comparator end signal 503 through a lossy signal path and with the capacitive loading (e.g., $C_L$).

As shown in diagram 500 of FIG. 5, driver output edge speed is slowed down by lossy transmission line effects first (e.g., tpd2), and is further slowed down at each comparator input by the capacitive loading (e.g., tpd3). When the speed grade of the ATE tester pin is not the same as the speed grade of the reference driver/comparator, the amount of the capacitive loading at both ends is significantly different, which causes the propagation delay dependency on signal propagation direction resulting in calibration error.

However, a primary ATE concern is the tester pin to tester pin skew. If all the tester pins of interest have the same amount of error with respect to the reference driver, it does not affect the timing alignment accuracy among tester pins. When the same speed grade ATE pins are to be calibrated, the deskew calibration at the driver/comparator junction becomes acceptably accurate because their capacitive loading variation is small. A real limitation of a 4-way calibration method arises from its implementation. As described above, at multi-Gbps data rate, DDJ is one of the major timing error sources. Since all the tester pins need to be connected to a single reference driver/comparator, those signal paths cannot have wide enough frequency bandwidth not to cause DDJ in practice. Additionally, the reference comparator input bandwidth is not wide enough to be used for data dependent calibration.

DUT-Path Propagation Delay Calibration by TDR:

The actual timing error in loadboard calibration using ATE's TDR (time domain reflectometry) capability is caused by not only TDR methodology but also each ATE's inherent error mechanism, such as, for example, signal path quality, comparator bandwidth, timing measurement accuracy, etc. Therefore it is possible to find an empirical rule for a specific ATE that seems to minimize the calibration error because error by TDR methodology itself could be accidentally compensated by an ATE's inherent error to some extent. As discussed below, TDR methodology itself is essentially inaccurate, and therefore alternative calibration methods need to be used.

Figure 6:
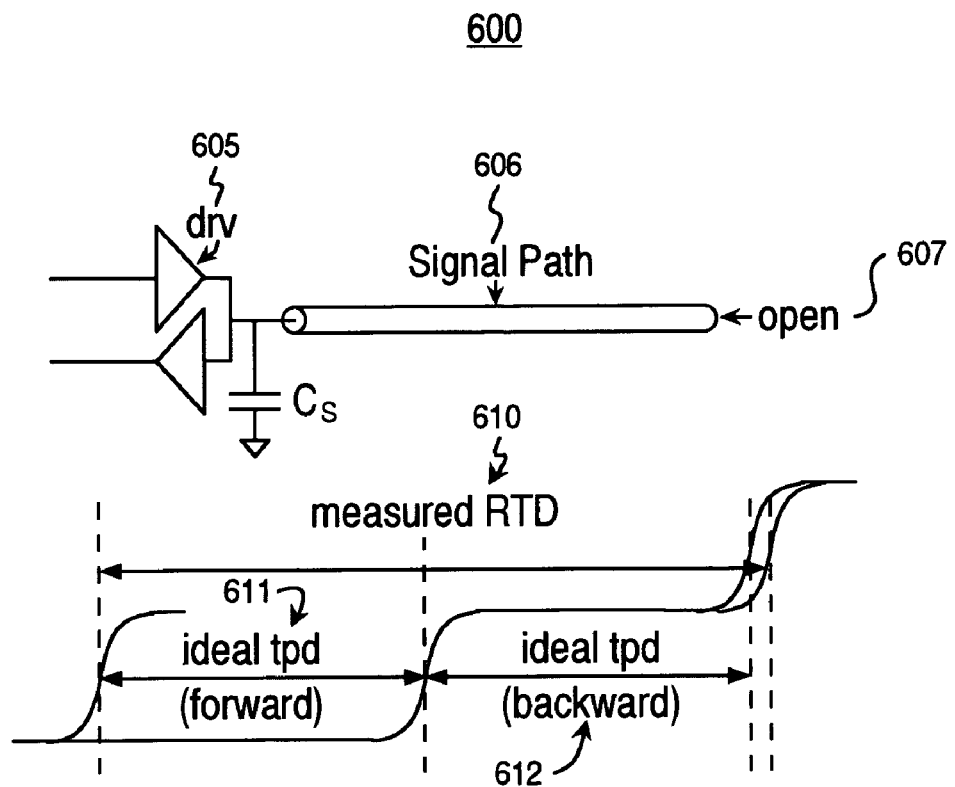
FIG. 6 shows a first scenario for ATE-to-DUT signaling propagation in accordance with one embodiment of the present invention.
Figure 7:
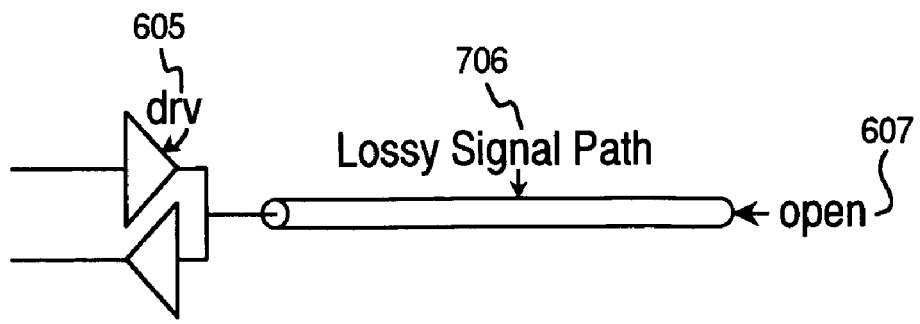
FIG. 7 shows a second scenario for ATE-to-DUT signaling propogation in accordance with one embodiment of the present invention.
Figure 7:
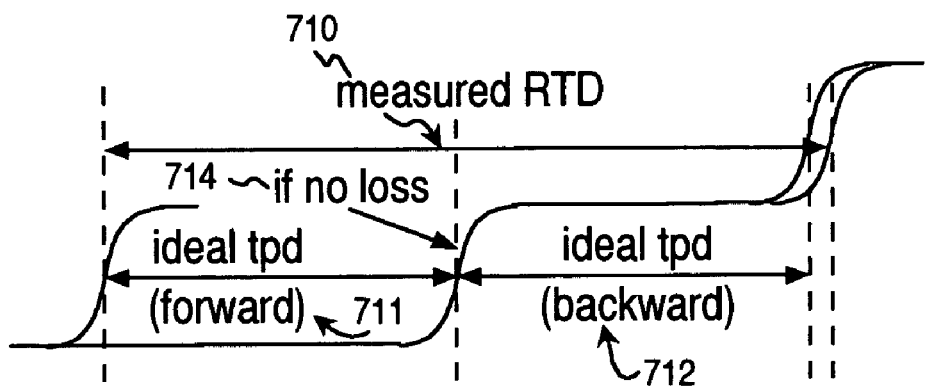

FIG. 6, FIG. 7, FIG. 8, and FIG. 9 show four scenarios for ATE-to-DUT signaling propagation. The actual loadboard calibration with socket is a combination of one or more of these scenarios. Diagram 600 of FIG. 6 shows a comparator input loading senario. When the reflected signal (e.g., from the driver 605 through the signal path 606 to the "open" 607 then reflected back towards driver 605) that arrives at the comparator input, the edge is slowed down by the capacitive loading (e.g., $C_S$) which does not happen in forward signal transmission, resulting in measurement error. Thus, the measured round-trip delay (RTD) 610 is longer than the sum of the ideal forward tpd 611 and the ideal backward tpd 612. Diagram 700 of FIG. 7 shows a lossy signal path scenario. The incident signal edge is slowed down during forward signal transmission through the signal path 706 and it is further slowed down in backward signal transmission resulting in measurement error. Thus, the measured round-trip delay (RTD) 710 is longer than the sum of the ideal forward tpd 711 and the ideal backward tpd 712. Line 714 shows the timing of the incident signal edge if there were no loss.

Figure 8:
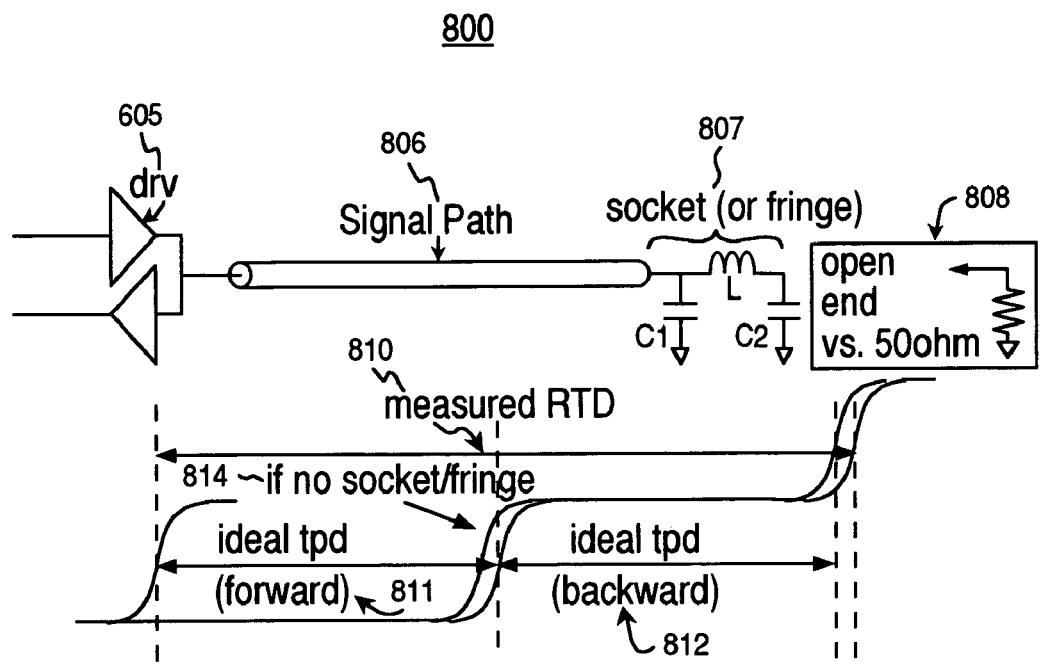
FIG. 8 shows a third scenario for ATE-to-DUT signaling propagation in accordance with one embodiment of the present invention.
Figure 9:
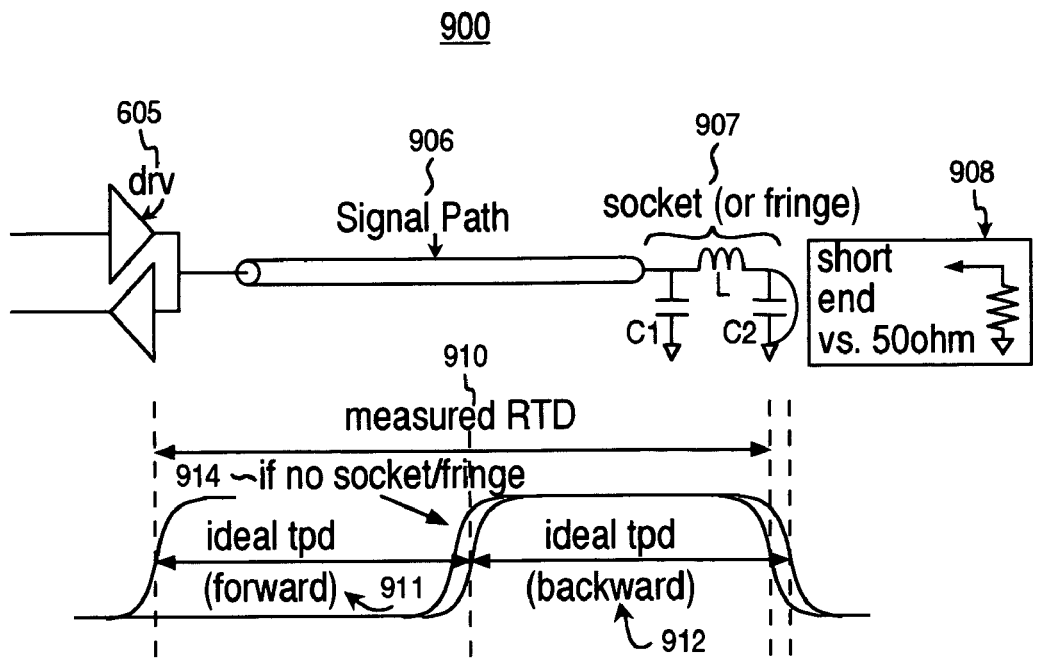
FIG. 9 shows a fourth scenario for ATE-to-DUT signaling propagation in accordance with one embodiment of the present invention.

Diagram 800 of FIG. 8 shows an open TDR scenario. Since the parasitic capacitance of the socket end 807 (C2) is in parallel with the 50 ohm termination 808 during device testing, effectively reducing the time constant, open TDR overestimates propagation delay for the signal path 806 and 807. Thus, the measured round-trip delay (RTD) 810 is longer than the sum of the ideal forward tpd 811 and the ideal backward tpd 812. Line 814 shows the timing of the incident signal edge at DUT if there were no socket or fringe effects. Diagram 900 of FIG. 9 shows a shorted TDR scenario. Since shorting the socket end 907 to ground removes the socket end parasitic capacitance (C2) during calibration, effectively reducing the time constant, shorted TDR underestimates propagation delay for the signal path 906 and 907. Thus, the measured round-trip delay (RTD) 910 is longer than the sum of the ideal forward tpd 911 and the ideal backward tpd 912. Line 914 shows the timing of the incident signal edge at DUT if there were no socket or fringe effects.

Figure 10:
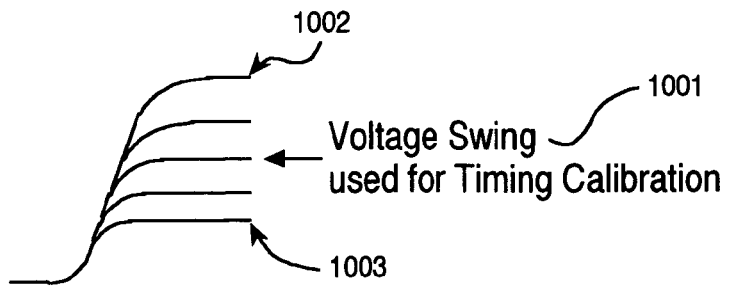
FIG. 10 shows a diagram illustrating the driver output timing variation versus the output voltage swing in accordance with one embodiment of the present invention.

Driver Output Rise/Fall Time vs. Voltage Swing:

FIG. 10 shows a diagram 1000 illustrating the driver output timing variation versus the output voltage swing. While timing calibration is done at one voltage swing, tester pin output timing varies depending on its output voltage as illustrated in FIG. 10. The voltage swing used for timing calibration a shown by line 1001. As shown in diagram 1000, higher voltage swings (e.g., 1002) and lower voltage swings (e.g., 1003) will result in different timings. In order to correct the voltage swing dependent timing error, the rise/fall time of tester pin output for various voltage swings is measured, and used for the calibration. Since this calibration measurement is done by the reference comparator discussed above (e.g. FIG. 3), the calibration error amount depends on the difference in signal degradation between the calibration condition and actual device test environment.

Figure 11:
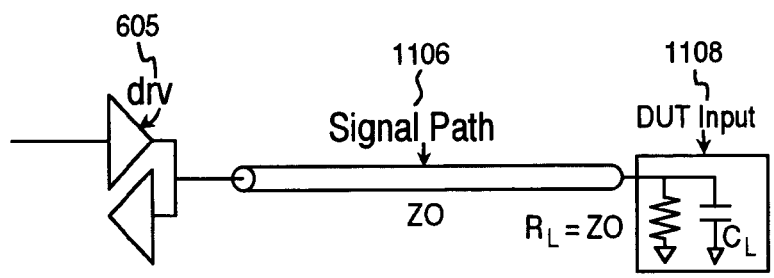
FIG. 11 shows a diagram depicting a device under test input loading effect on stimulus timing in accordance with one embodiment of the present invention.
Figure 11:
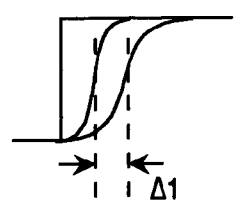

DUT Input Loading Effect:

FIG. 11 shows a diagram 1100 depicting a DUT input loading effect on stimulus timing. In order to calibrate the timing error due to the capacitive loading at DUT input 1108 for the signal path 1106, a simple calibration is provided as an option asking for an ATE user to specify the loading capacitor value (e.g., $C_L$). The stimulus waveform at DUT input is approximated by the step response of a low pass filter as illustrated in FIG. 11 and expressed by (Eq.9). The additional delay due to the capacitive loading at 50% voltage swing is expressed by (Eq.10) and (Eq.11). Since this method is based on a very primitive "rule of thumb", it's not very accurate.

$$v_{DUTin}(t) = V_0\left[1 - \exp\left(-\frac{t}{\tau}\right)\right] \quad \text{(Eq. 9)}$$

$$\Delta t = -\tau \times \log_e(0.5) \quad \text{(Eq.10)}$$

$$\tau = \frac{Z0}{2} \cdot C_L \quad \text{(Eq. 11)}$$

Figure 12:
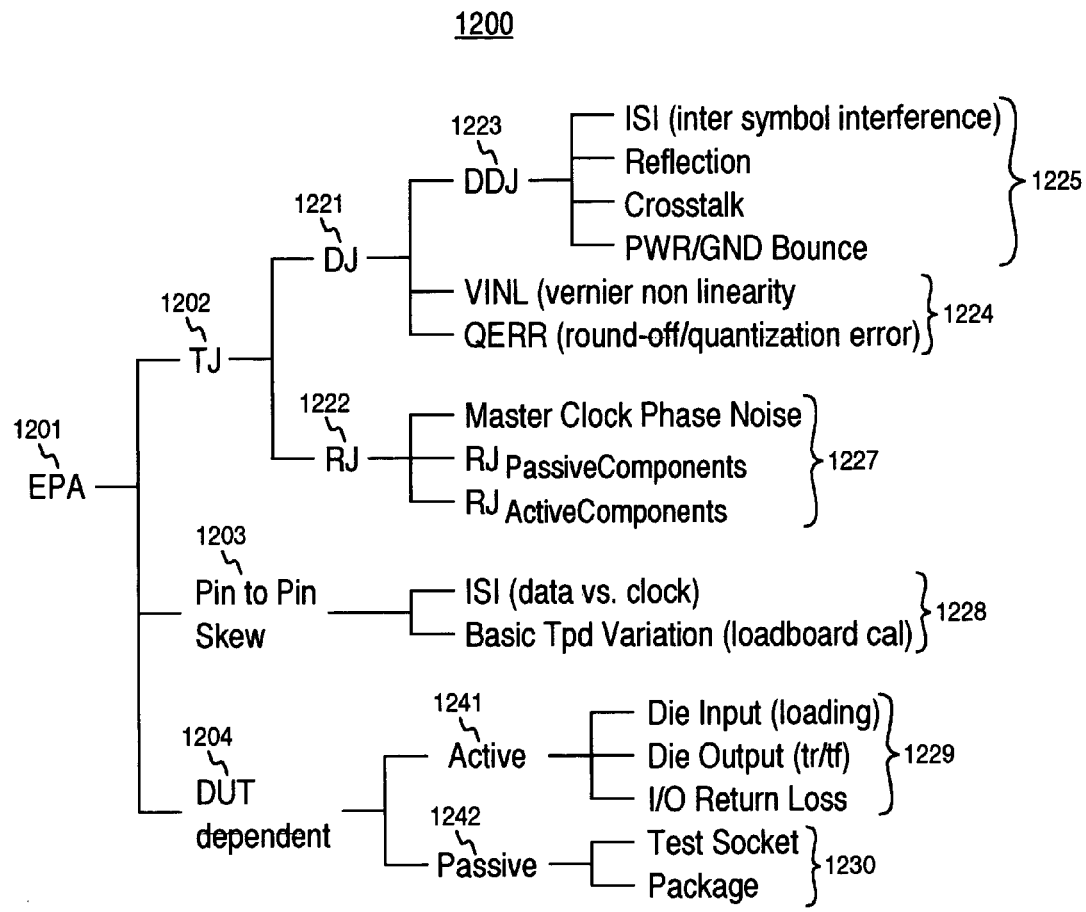
FIG. 12 shows a tree summarizing timing error components in testing a wide variety of devices at multi-Gbps in accordance with one embodiment of the present invention.
Figure 13:
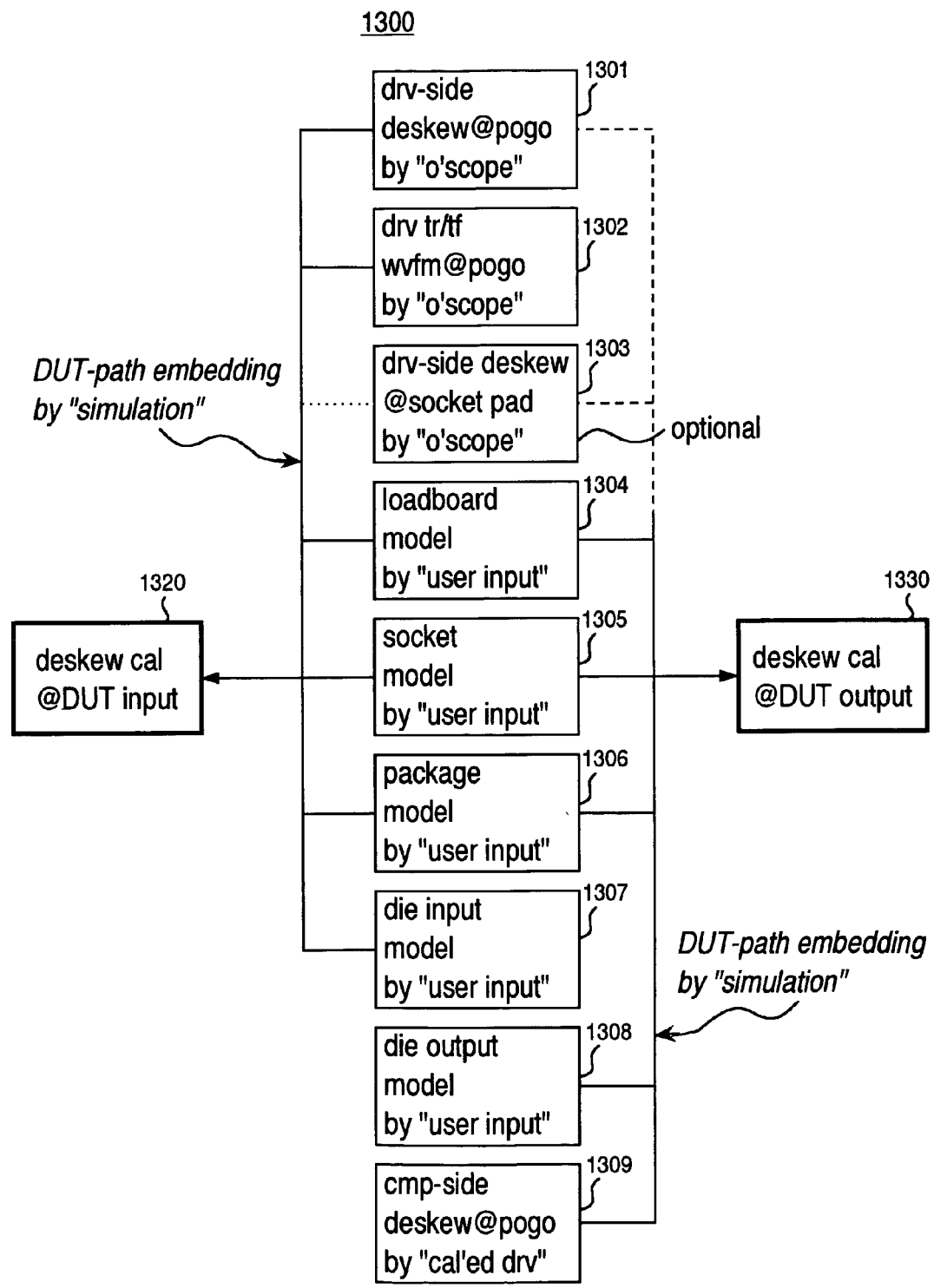
FIG. 13 shows a flow diagram illustrating a new timing calibration method in accordance with one embodiment of the present invention.

Improved ATE Timing Calibration Method at a Device Under Test:

Embodiments of the present invention take advantage of jitter analysis methodologies to analyze ATE timing accuracy from the view point of high speed serial communication device test, and identified various jitter components. Associated timing error components are added in order to include timing skew among multiple tester pins and DUT I/O characteristics. FIG. 12 shows a tree 1200 summarizing these timing error components 1201–1242 in testing a wide variety of devices at multi-Gbps. Having accounted for the timing error/jitter sources shown in FIG. 12 and the fundamental limitations discussed above, embodiments of the present invention implement a new timing calibration method as illustrated in FIG. 13. This is an additional calibration for achieving higher timing accuracy at multi-Gbps testing. This method builds upon the traditional calibration scheme and can thus take advantage of any incremental accuracy improvements that may occur from time to time.

As shown in the flow diagram 1300 of FIG. 13, an improved timing calibration method in accordance with embodiments of the present invention has four distinctive features. One feature is the fact that pin-to-pin timing skew reduction is achieved not only at low data rates but also at actual device test speed. This means that DDJ calibration is performed, which requires both hardware and software support for this new calibration implementation. Another feature is the fact that drive-side deskew calibration is done first using a very wide frequency bandwidth oscilloscope (e.g., greater than 20 GHz) either at a pogo pin or socket mounting pad on a DUT specific loadboard. This is shown in steps 1301 through 1303. The pogo pin is the default calibration point because of its universal availability, and socket mounting pad is optional depending on the DUT pin assignment. Another feature is the fact that compare-side deskew calibration is done using already calibrated drive-side signal because of reducing the calibration time and the cost of the calibration reference, i.e. a known good pattern generator.

In one embodiment, the calibration measurement point is the pogo pin, as shown in step 1309. In a different embodiment, the calibration point is a socket mounting pad. In order to move the deskew calibration point from the pogo pin or socket mounting pad toward DUT, propagation delay and DDJ between physical calibration point and target calibration point is derived by circuit simulation, as shown in steps 1308 and 1309, and combined with physically measured calibration values. Simulation models for the load board, socket, package, die input, and die output for the DUT can be user provided, as shown by steps 1304 through 1308, or the corresponding s parameters can be physically measured. The result is an accurate, deskewed calibration at the DUT input (e.g., step 1320) and at the DUT output (e.g., step 1330).

Data Dependent Calibration:

Embodiments of the present invention provide a data dependent calibration (DDC) to reduce data dependent timing error/jitter in ATE (e.g., including the loadboard, socket, and package) for both drive-side and compare-side considering not only the current event type but also the previous bit patterns.

Example Simulation Results with K28.5 Bit Pattern:

Simulation results are now described to illustrate the manner in which DDC in accordance with embodiments of the present invention function. In one example, a simulated circuit consists of three stages of packaged high speed buffers using bipolar transistor technology with lossy interconnects between them. Since a well-known "K28.5" pattern is often used for DDJ evaluation of telecom/datacom physical layer components and it contains a variety of bit patterns in only 20 bits duration, this pattern is the basis of the following discussions.

Figure 14:
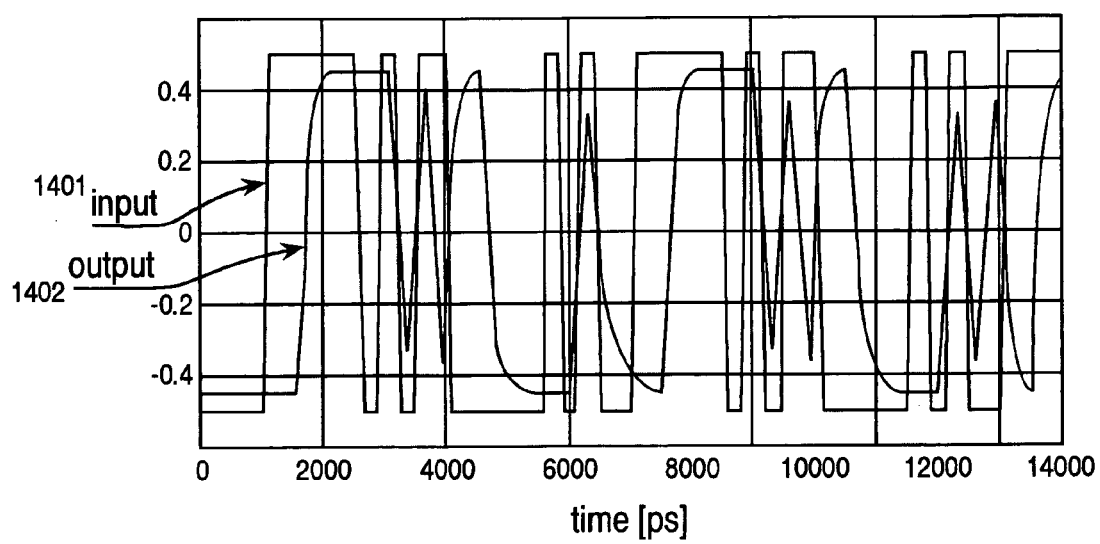
FIG. 14 shows a graph illustrating input and output waveforms associated with a K28.5 pattern in accordance with one embodiment of the present invention.

FIG. 14 shows a graph 1400 illustrating input and output waveforms associated with a K28.5 pattern. Graph 1400 shows the input and output waveforms where 1 UI is 300 ps. The input waveform is the square waveform indicated by line 1401. The output waveforms is indicated by line 1402.

Figure 15:
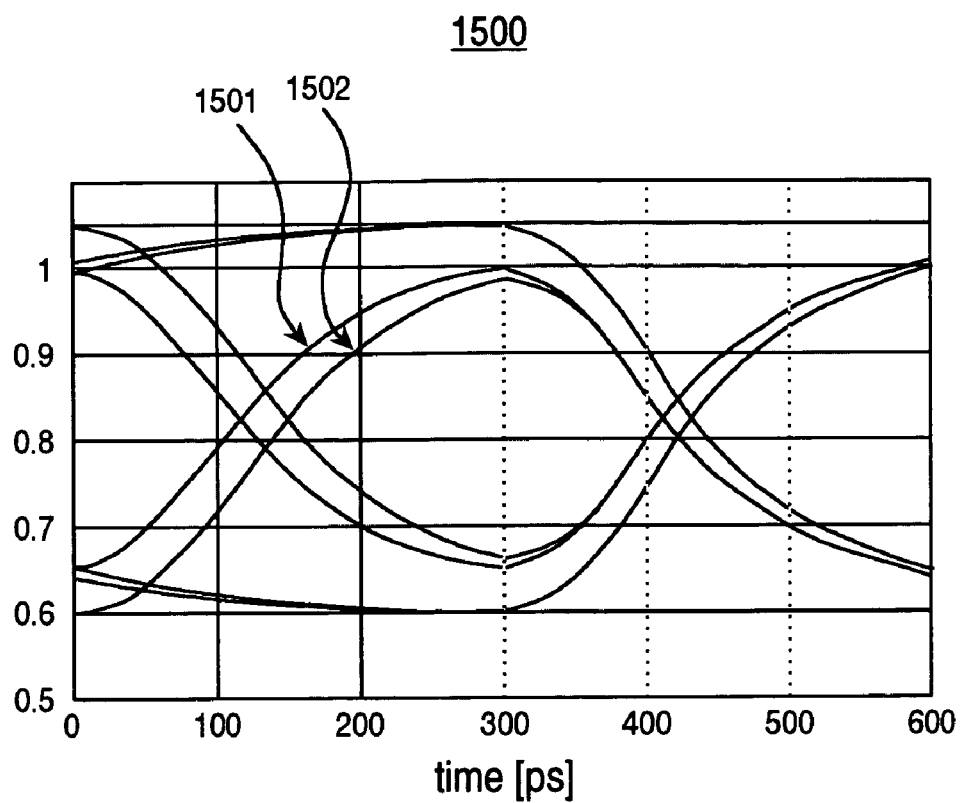
FIG. 15 shows an "eye diagram" of an output waveform having significant DDJ in accordance with one embodiment of the present invention.

FIG. 15 shows an "eye diagram" of the output waveform 1402. Lines 1501 and 1502 show the existence of about 35 ps DDJ. It should be noted that this DDJ is caused by not a single path segment but a cascading of several stages including both passive and active circuits.

Figure 16:
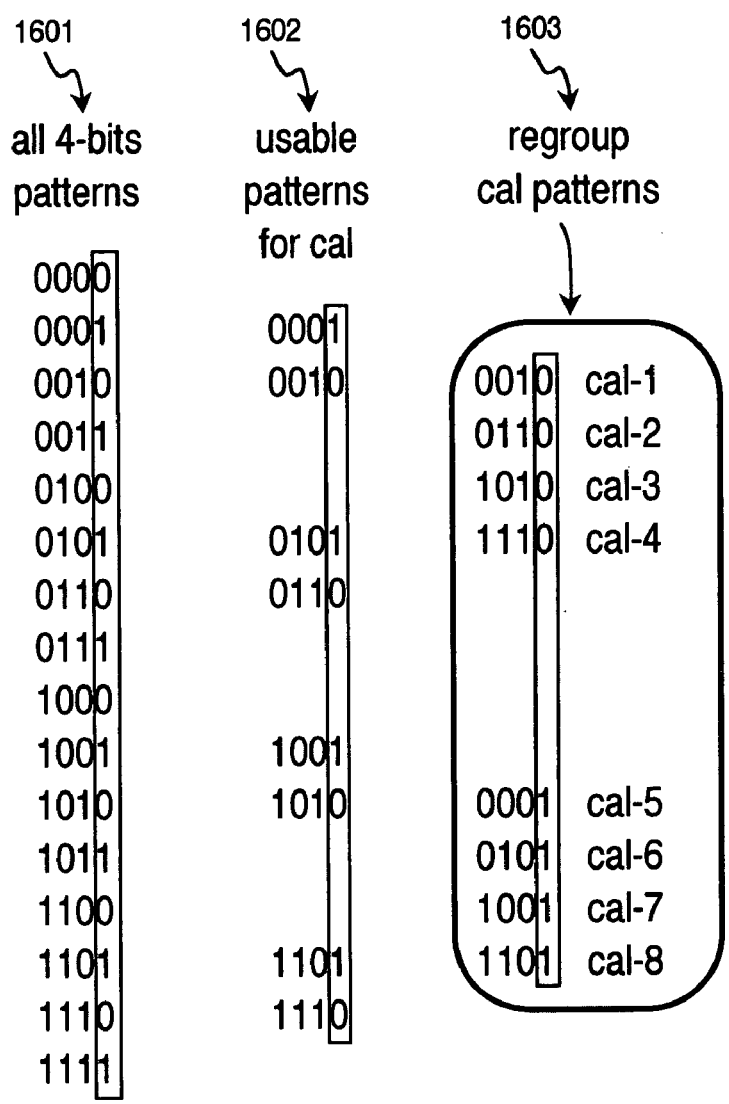
FIG. 16 shows a diagram depicting bit patterns used for data dependent calibration of automatic test equipment in accordance with one embodiment of the present invention.

Calibration Measurements for DDC:

FIG. 16 shows a diagram 1600 depicting bit patterns used for data dependent calibration of automatic test equipment in accordance with one embodiment of the present invention. Since the DDC implementation on ATE hardware in accordance with the present FIG. 16 embodiment can take into account three previous bits, there are sixteen bit patterns (e.g., four bit patterns 1601) which occur to consider to determine the calibration value for each event. As DDJ becomes critical only when the current event is different from the previous event, there are only eight 4-bit patterns (e.g., the usable four bit patterns at 1602) necessary for the calibration. This is illustrated in FIG. 16, where the mapping between the calibration values 1603 (e.g., cal-1, cal-2, etc.) and the corresponding bit patterns is shown. While the hardware takes into account three previous bits, four previous bits are considered in the calibration measurements using the average of the corresponding two measurement results to determine each cal-x value (x=1,2, . . . 8). It should be noted that in other implementations, an additional number of bits can be taken into account.

Figure 17:
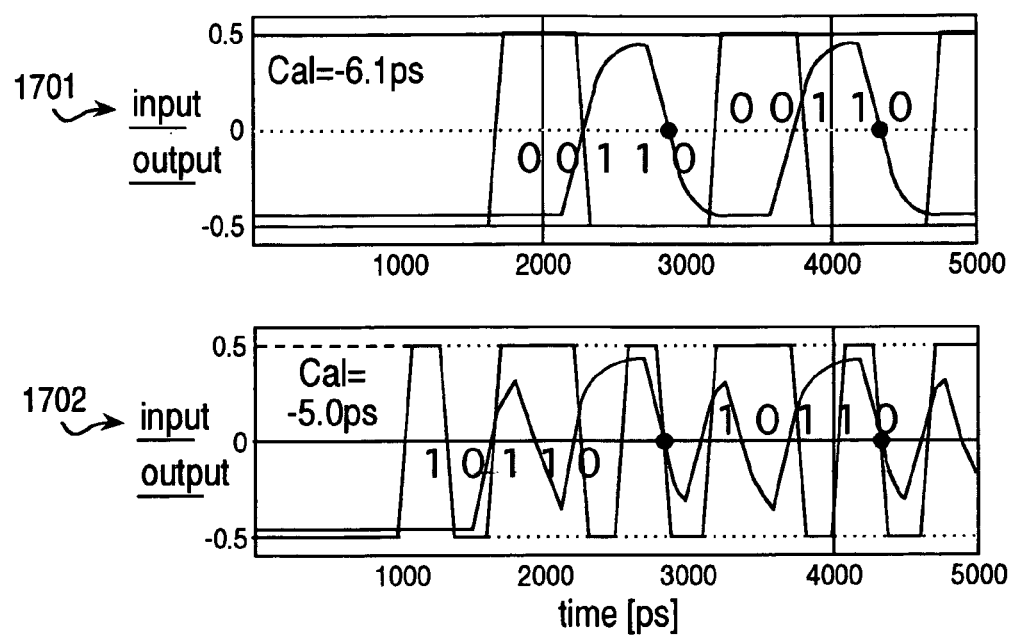
FIG. 17 shows a first diagram depicting two calibration patterns in accordance with one embodiment of the present invention.
Figure 18:
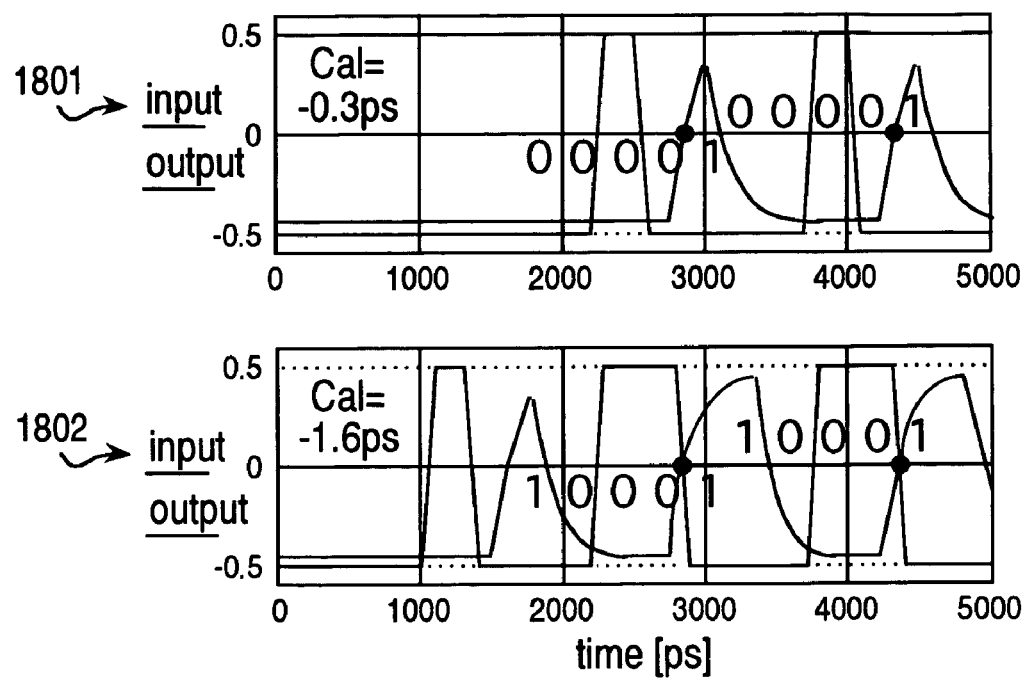
FIG. 18 shows a second diagram depicting two calibration patterns in accordance with one embodiment of the present invention.
Figure 19:
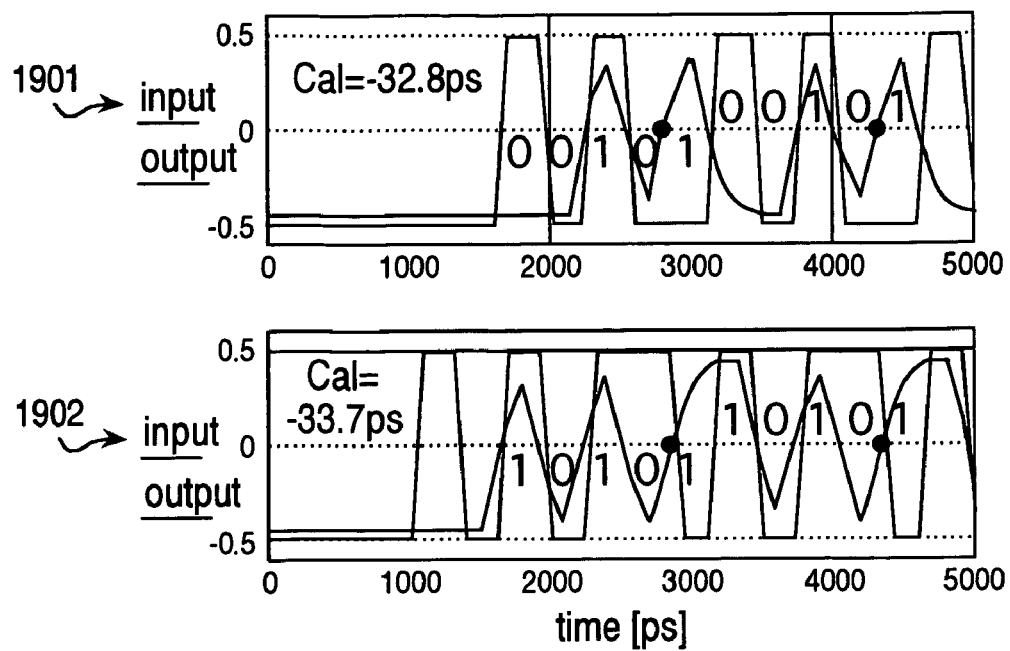
FIG. 19 shows a third diagram depicting two calibration patterns in accordance with one embodiment of the present invention.

FIG. 17, FIG. 18, and FIG. 19 show three example calibration measurements. FIGS. 17–19 each show two calibration patterns (e.g., 1701–1702, 1801–1802, and 1901–1902) with the measured (simulated) calibration values used to obtain one calibration value. A negative value means the actual edge transition timing was earlier than ideal. Therefore the corresponding edge should be intentionally delayed at the timing generator by this amount for drive-side or strobed earlier for compare-side to compensate for the DDJ.

Figure 20:
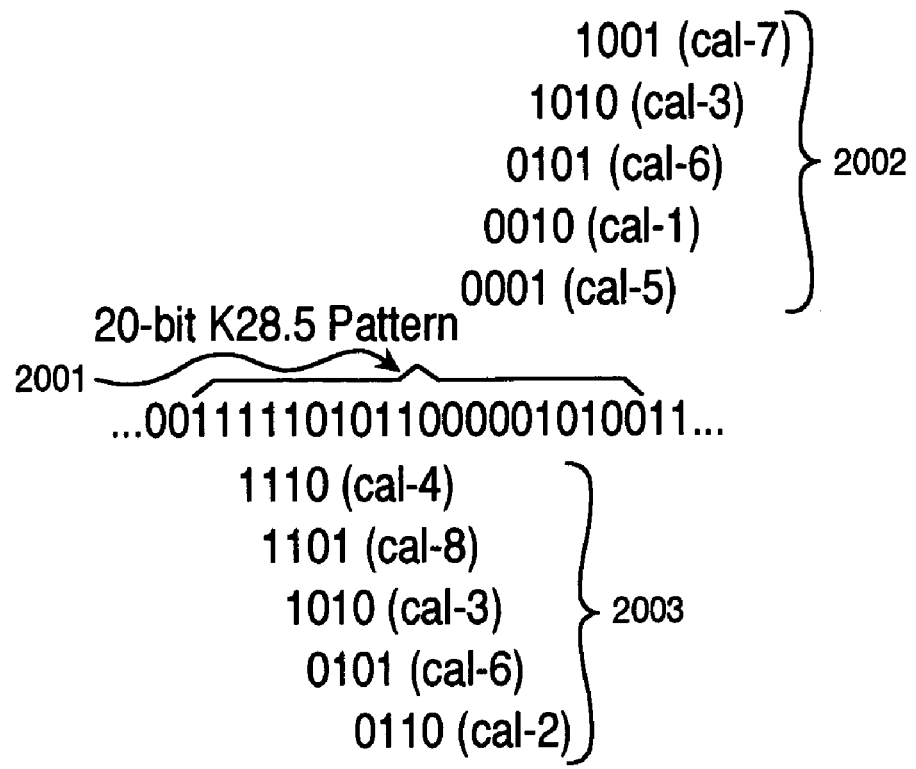
FIG. 20 shows a diagram depicting the relationship between a K28.5 bit pattern and data calibration patterns in accordance with one embodiment of the present invention.

Eye Diagrams of K28.5 Bit Pattern after Calibration:

FIG. 20 shows a diagram 2000 depicting the relationship between a K28.5 bit pattern and data calibration patterns in accordance with one embodiment of the present invention. As seen in FIG. 20, the 20 bit K28.5 pattern 2001 requires all the eight data dependent calibration values 2002–2003. In the diagram 2000 example, the calibration values obtained in FIG. 16 were applied to the input signal, and the output signal was simulated.

Figure 21:
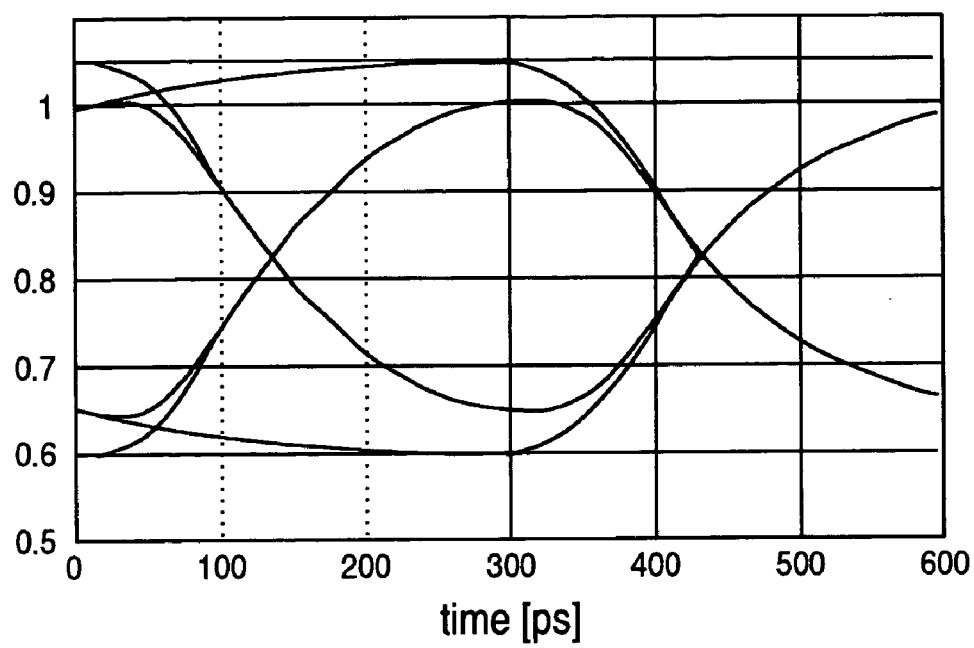
FIG. 21 shows an output eye diagram for the K28.5 bit pattern after DDC (data dependent calibration) in accordance with one embodiment of the present invention.

FIG. 21 shows an output eye diagram 2100 for the K28.5 bit pattern after DDC. The eye diagram 2100 shows the output waveform after the calibration, where one can recognize that DDJ has been almost eliminated (e.g., in comparison to diagram 1500 of FIG. 15). Note that vertical eye opening does not change much because it is determined by the output circuit characteristic of the final stage buffer.

Calibration Measurements:

As described in the discussion of FIG. 3 above, at-speed calibration measurement is required to calibrate DDJ. As described in the discussion of FIGS. 4–5 above, the effect of any component between the physical measurement point and the target calibration point (e.g., DUT I/O pin) needs to be calibrated by some means. The methodology for the physical calibration measurements and effective calibration at DUT are now described. This methodology will show how to move the effective calibration point from the physical measurement point to the target calibration point.

Figure 22:
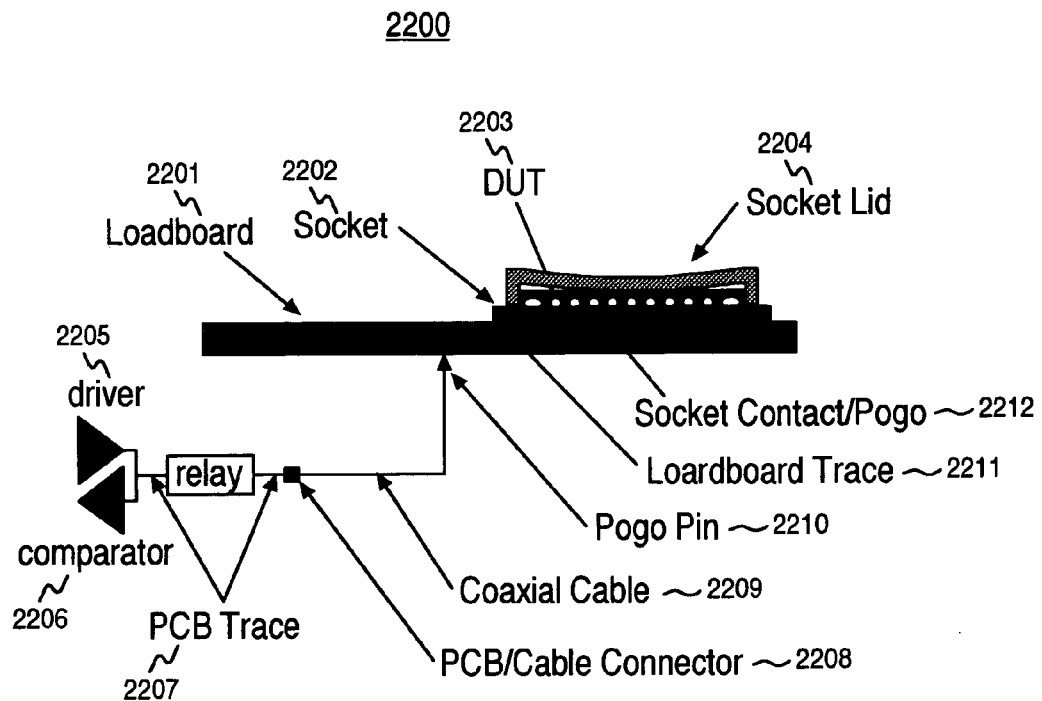
FIG. 22 illustrates a diagram depicting a device under test input/output signal path and its automatic test equipment test set up in accordance with one embodiment of the present invention.

Calibration Measurement at Pogo Pin:

FIG. 22 illustrates a diagram 2200 depicting a DUT input/output signal path and its automatic test equipment test set up (e.g., components 2201–2212). The DUT input/output signal path in an ATE environment is used to identify suitable measurement point. The potential candidates are now described.

Driver/comparator junction: The physical measurement point is inside a package, and a high frequency high impedance probe needs to be attached to it. It is not a practical possibility.

Somewhere between driver/comparator junction and DUT: Not disturbing DUT I/O signal is quite difficult by attaching a high frequency high impedance probe or inserting directional couplers. Both high impedance probe and directional coupler would require signal amplification introducing another error source.

Pogo pin: The pogo pin (e.g., pogo pin 2210) pitch is not too small to develop a robust probe, and signal pin always accompanies ground pin(s) next to it allowing high quality probing. Therefore it is a good candidate. In order for the pogo pin 2210 to be qualified, signal path around it must be a good 50 ohm environment because terminating a signal at this point by 50 ohm load for drive-side calibration or injecting signal there from 50 ohm output impedance signal source for compare-side calibration should not be different from actual signal activity during device test. In order to achieve this condition, the interconnection quality is specified usually using insertion loss and return loss. Evaluating the insertion loss effect on DDJ is straightforward and could be intuitively understood. On the other hand, using return loss to specify the tolerable amount of impedance discontinuity for a given data rate (i.e. edge transition speed) with understanding its physical meaning seems to be a big challenge.

Vias beneath DUT from the back side of the loadboard: The issue of using high impedance probe was already mentioned above. Probing from the backside of a loadboard would not be practical for very high speed application because such an application would use advanced PCB technology such as blind vias or back drilling eliminating the expected probing points for the sake of better signal integrity.

Socket mounting pad: Considering the industry trend toward higher pin counts, it seems to be reasonable to assume the existence of BGA packages as DUTs. Almost all the BGA sockets for very high speed and/or high frequency applications today use spring contacts between a loadboard and DUT's solder balls. Such a loadboard has contact pads on the surface providing potentially good probing points before mounting the socket. However, when there are many high speed signals, especially differential signals, they do not always have ground pads adjacent to them, which prohibits high quality probing at the pads. Therefore the socket mounting pad cannot be considered as a universal calibration point.

Socket pin from top: In addition to the ground pad problems mentioned above, it is very difficult to make a fine pitch probe tip, especially differential probe tips, which can make reliable contact with the spring contact of the socket maintaining good signal integrity.

Having reviewed the above candidates, the pogo pin is the preferred point that is usually available for high quality at-speed calibration measurements. In one embodiment, to maintain superior repeatability, the probing at pogo pin and/or socket mounting pad is automated.

Figure 23:
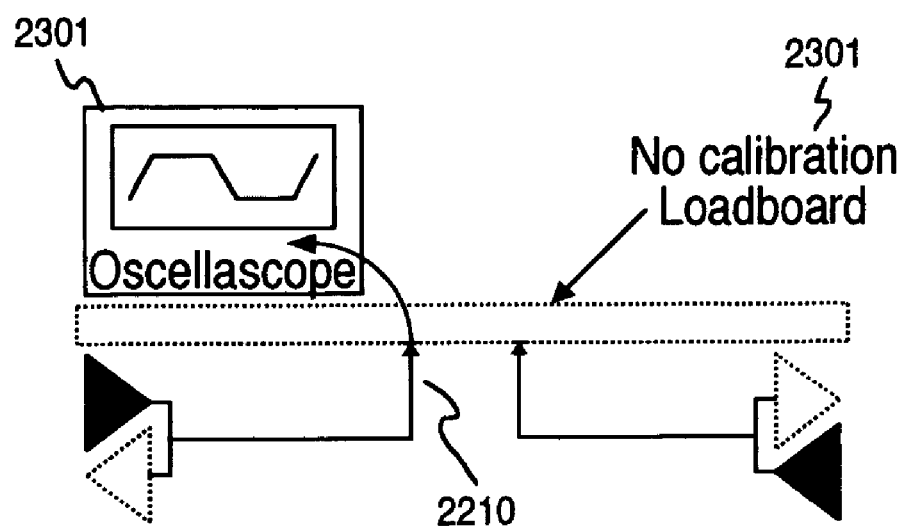
FIG. 23 shows a diagram illustrating a drive-side calibration measurement by a wide frequency bandwidth oscilloscope at the pogo pin in accordance with one embodiment of the present invention.

Drive-Side Calibration Measurement:

FIG. 23 shows a diagram 2300 illustrates a drive-side calibration measurement by a wide frequency bandwidth oscilloscope 2301 at the pogo pin 2210 without a calibration loadboard in accordance with one embodiment of the present invention. In the present embodiment, using a special probe (e.g., a single-ended 50 ohm probe and a dual 50 ohm probe for a differential pair), the driver output signal is measured by a high frequency sampling oscilloscope at each pogo pin requiring no special loadboard. This is illustrated in diagram 2300 by the dashed box 2301. The DDJ, timing skew and waveform of each pin at the data rates and the voltage levels of interest are measured using the calibration patterns described in the discussion of FIG. 16.

Figure 24:
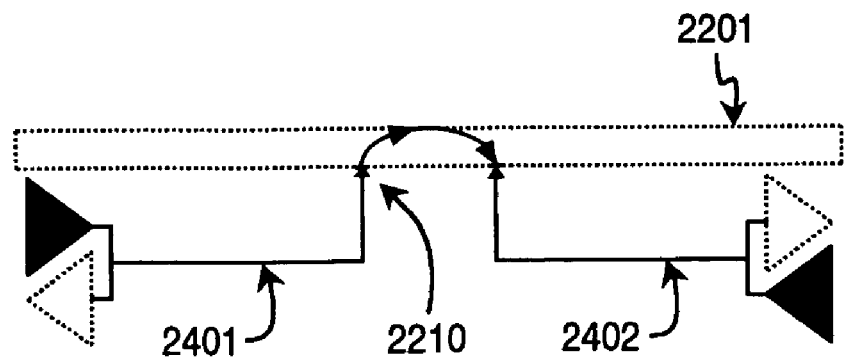
FIG. 24 shows a diagram illustrating compare side calibration measurement by a previously calibrated calibrated driver-side signal at the pogo pin in accordance with one embodiment of the present invention.

Compare-side Calibration Measurement:

FIG. 24 shows a diagram 2400 illustrating compare side calibration measurement by a previously calibrated driver-side signal at the pogo pin 2210 in accordance with one embodiment of the present invention. An already calibrated drive-side 2401 is connected to the compare-side 2402, which is to be calibrated, at their pogo pins (e.g., pogo pin 2210) using a calibration loadboard 2201 as illustrated in FIG. 24. In a typical case, while propagating from a pogo pin to the strobing point, a driver output signal is distorted and DDJ is induced. The signal timing of each calibration pattern discussed above is measured by strobe search as the compare-side calibration measurement.

Figure 25:
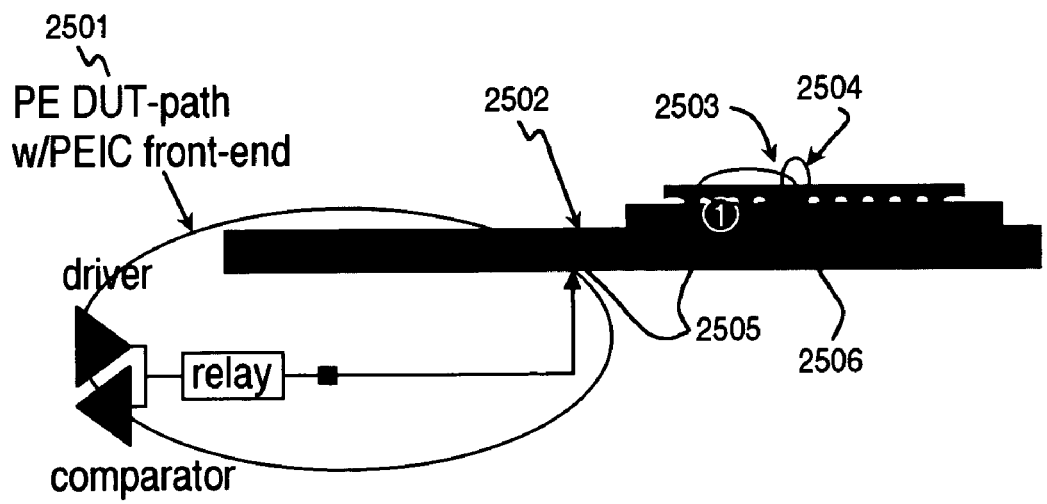
FIG. 25 shows a diagram showing the modeled components between a pogo pin and die I/O for a device under test in accordance with one embodiment of the present invention.

Calibration at DUT:

FIG. 25 shows a diagram 2500 showing the modeled components between a pogo pin and die I/O for a DUT in accordance with one embodiment of the present invention. The components 2501 shows the PE DUT-path with PEIC front-end (but not limited to the front-end only), 2502 shows the lossy transmission lines of the load board, 2503 is the modeled DUT package, 2504 is the die I/O pin, 2505 are the vias, and 2506 is the socket. It should be noted that regardless of where physical calibration measurements are done, the final calibration point needs to be at the DUT. There are several active and passive reasons why circuit simulation, which requires modeling the components 2501–2506 in the test signal path as illustrated in diagram 2500, is used for high speed and high accuracy calibration. These reasons are now described.

As discussed above, traditionally used TDR is essentially inaccurate to calibrate the high frequency effect of loadboard and test socket (e.g., passive reason). Modeling and simulation accuracy of passive components has been improving and becoming increasingly popular (e.g., active reason). Although the typical final calibration point used to be at the DUT I/O pin, simulation makes it possible to move the calibration point to the die I/O pad using the package and the I/O buffer models in the calibration simulation (e.g., active reason). The physical calibration measurement point is assumed to be at pogo pin as described in FIG. 26 and FIG. 27 above.

Figure 26:
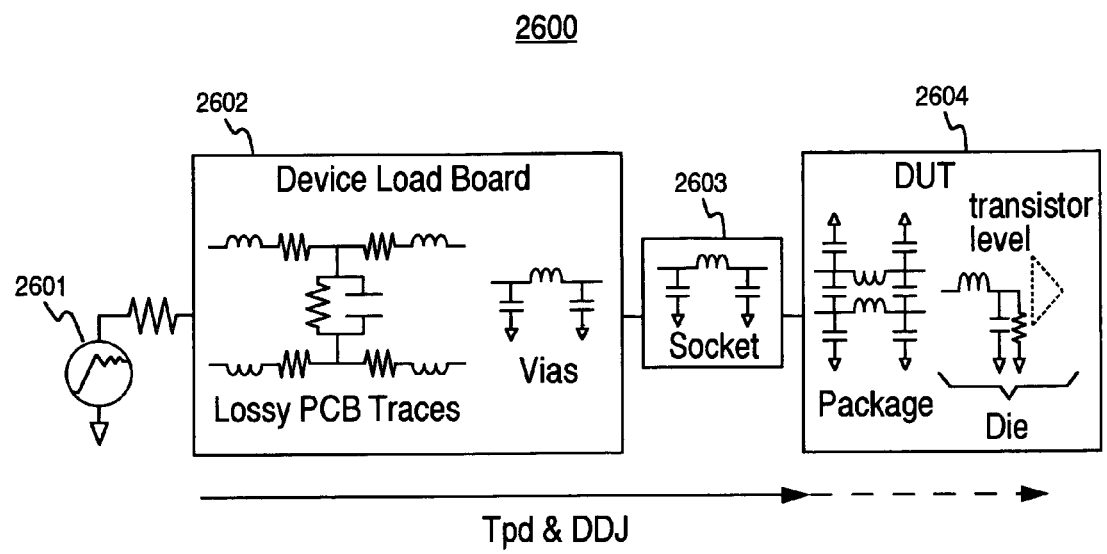
FIG. 26 shows a diagram of one example circuit model used in calibration in accordance with one embodiment of the present invention.

Moving Drive-Side Calibration Toward DUT:

FIG. 26 shows a diagram 2600 of one example circuit model used in calibration in accordance with one embodiment of the present invention. Block 2601 shows the test data readouts of the ATE, block 2602 shows the model of the device load board, block 2603 shows the model of the DUT socket, and block 2604 shows the model of the actual DUT. It should be noted that diagram 2600 is one of many possible examples and as described for the purposes of illustration.

In practice, actual circuit models should preferably be developed for each loadboard and DUT. In the present embodiment, the measured driver output waveform after DDJ calibration is modeled by a piece-wise-linear voltage source with a filter smoothing the waveform, and the output impedance is modeled by a 50 ohm resistor. Loadboard traces must be modeled by lossy transmission lines. Vias, the test socket and/or the DUT package may be modeled by R-L-C components. Advanced simulators can use S-parameters to model all these passive components, which would result in much higher accuracy when properly used. The input buffer loading can be modeled by either transistor circuit or approximated lumped element(s) depending on the user's need. Once the circuit model from the pogo pin to the DUT is created, the propagation delay (e.g., tpd) and DDJ with the calibration patterns discussed above are simulated. Then the calibration values derived from the simulation are combined (e.g., algebraically added) with the calibration values obtained from the physical calibration measurements providing with the overall calibration values.

Figure 27:
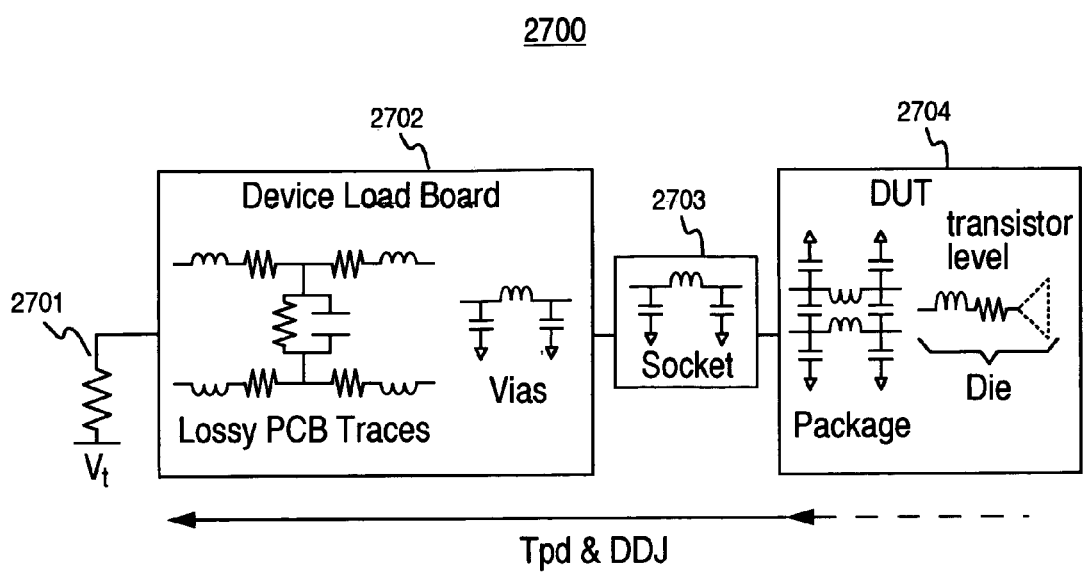
FIG. 27 shows a diagram of one example circuit model used in calibration in accordance with one embodiment of the present invention.

Moving Compare-Side Calibration Toward DUT:

FIG. 27 shows a diagram 2700 of one example circuit model used in calibration in accordance with one embodiment of the present invention. Element 2701 shows a resistor representing ATE loading at the pogo-pin, block 2702 shows the model of the device load board, block 2703 shows the model of the DUT socket, and block 2704 shows the model of the actual DUT. It should be noted that diagram 2700 is one of many possible examples and as described for the purposes of illustration.

In practice, actual circuit models should preferably be developed for each loadboard and DUT. The die output buffer would be modeled by either transistor circuit or a piece-wise-linear voltage source with a filter combined with source termination circuitry if necessary. Loadboard traces, vias, test socket and/or DUT package are modeled in the same way as in the drive-side. The loadboard end at the pogo pin is terminated by a 50 ohm resistor to the intended voltage level. Once the circuit model from the DUT to the pogo pin is created, the propagation delay and DDJ are simulated, and the simulation-derived calibration values are combined with the physically measured calibration values providing the overall calibration values as done in the drive-side.

Future Extensions:

It should be noted that since DDC, full utilization of circuit simulation, and combining them to calibrate ATE at DUT in accordance with embodiment of the present invention are new methods, there maybe various concerns to work out. Such concerns are briefly described below. For example, in one embodiment, physically measured calibration values and simulation-derived calibration values are algebraically added. While this method is very useful for drive-side calibration, there remains a residual timing error in compareside because the rise/fall time of the reference signal used for the physical calibration measurement is different from the ones of the actual DUT output at the pogo pin. There exists a need to develop a method to correct this residual error.

A conceptually straightforward method to achieve the goal above is to develop a compare-side model from pogo pin, combine it with DUT specific model consisting of loadboard, socket and DUT, and run simulation to obtain the overall calibration values. There may exist, however, one or more problems in this approach. For example, when a transistor level die model is involved in the calibration, the circuit simulator varies from customer to customer, and it would not be practically possible to develop accurate ATE models for various simulators. Having considered the high accuracy expectation, the complexity of the driver/comparator IC and the DUT signal path including relays, PCB traces, a coaxial cable, etc., using an advanced simulator is inevitable though.

In one embodiment, DDC needs to be performed at each data rate with each voltage level for the moment, which is very time consuming. There exists a need to study the DDJ mechanism in more detail so that interpolation and/or extrapolation can be used to reduce the number of the physical measurements to cover all the data rates and voltage ranges available for an ATE or a certain range required for testing each DUT.

In one embodiment, depending on DUT pin assignments, the impedance continuity at the socket mounting pad is not always good for our 50 ohm probing as discussed in the section 3.3.1. This point is, however, a good probing point for the characterization of the loadboard alone using a vector network analyzer (VNA). Since the probing in time domain currently uses only forward transmission information, utilizing the backward transmission (i.e. reflection) might help address this issue considering the success of the VNA method.

In one embodiment, although a commercially available oscilloscope is used for drive-side calibration, a more cost effective dedicated sampling module can be developed. Additionally, although an already-calibrated drive-side signal is used to calibrate compare-side, there exists a need to study how much more timing error reduction can be achieved by using a more accurate pattern source. If such a solution works, a more cost effective dedicated pattern source can be developed.

CONCLUSION

Thus, having reviewed traditional timing calibration methods in detail, the essential limitations in the traditional calibration methods and the necessity of investigating alternatives for ever increasing higher timing accuracy requirement have been recognized. In order to address such need, the new calibration methods of embodiment of the present invention which adds data dependent timing error/jitter calibration and utilization of signal path modeling and circuit simulation have been developed. Additionally, as a roadmap for the new calibration method embodiments, additional improvements for extensions of the capabilities of embodiments of the present invention have been described.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for improved ATE (automatic test equipment) timing calibration at a DUT (device under test), comprising:
   accessing a DUT component using an ATE component;
   performing physical calibration on a first portion of signal pathways coupling the ATE component to the DUT component;
   performing a simulation based calibration on a second portion of signal pathways coupling the ATE component to the DUT component; and
   combining physical calibration results with simulation based calibration results to calibrate timing propagation delay between the ATE component and the DUT component.

2. The method of claim 1, wherein the physical calibration on the first portion of signal pathways is performed using TDT (time domain transfer).

3. The method of claim 1, wherein the simulation based calibration on the second portion of signal pathways is performed using at least one circuit parameterized model of the second portion of the signal pathways.

4. The method of claim 1, wherein the timing propagation delay is calibrated in a signal propagation direction from the ATE component to the DUT component.

5. The method of claim 1, wherein the timing propagation delay is calibrated in a signal propagation direction from the DUT component to the DUT component.

6. The method of claim 1, wherein the calibration of the timing propagation delay calibrates a pin-to-pin timing skew of the DUT component.

7. The method of claim 6, wherein the calibration of the timing propagation delay calibrates DDJ (data depended jitter) of the DUT component.

8. The method of claim 1, further comprising:
   performing drive-side calibration using a wide frequency bandwidth wave form and timing measurment means.

9. The method of claim 8, wherein the drive-side calibration is performed at a pogo pin of a loadboard for the DUT component.

10. The method of claim 8, wherein the drive-side calibration is performed at a socket mounting pad of a loadboard for the DUT component.

11. The method of claim 1, further comprising:
    performing compare-side calibration using a previously calibrated drive-side signal.

12. The method of claim 11, wherein the compare-side calibration is performed at a pogo pin or at a socket mounting pad of a loadboard for the DUT component.

13. The method of claim 1, further comprising:
    moving a deskew calibration point from a pogo pin of a loadboard toward the DUT component.

14. The method of claim 1, further comprising:
    moving a deskew calibration point from a socket mounting pad of a loadboard toward the DUT component.

15. A system for improved ATE (automatic test equipment) timing calibration at a DUT (device under test), comprising:
    an ATE component configured for accessing a DUT component, the ATE component configured to perform physical calibration on a first portion of signal pathways coupling the ATE component to the DUT component; and a computer system for performing a simulation based calibration on a second portion of signal pathways coupling the ATE component to the DUT component, wherein physical calibration results are combined with simulation based calibration results to calibrate timing propagation delay between the ATE component and the DUT component.

16. The system of claim 15, wherein the physical calibration on the first portion of signal pathways is performed using TDT (time domain transfer).

17. The system of claim 15, wherein the simulation based calibration on the second portion of signal pathways is performed using at least one circuit parameterized model of the second portion of the signal pathways.

18. The system of claim 15, wherein the timing propagation delay is calibrated in a signal propagation direction from the ATE component to the DUT component.

19. The system of claim 15, wherein the timing propagation delay is calibrated in a signal propagation direction from the DUT component to the DUT component.

20. The system of claim 15, wherein the calibration of the timing propagation delay calibrates a pin-to-pin timing skew of the DUT component.

21. The system of claim 20, wherein the calibration of the timing propagation delay calibrates DDJ (data depended jitter) of the DUT component.

22. The system of claim 15, further comprising:
means for performing drive-side calibration using a wide frequency bandwidth waveform and timing measurement means.

23. The system of claim 22, wherein the drive-side calibration is performed at a pogo pin of a loadboard for the DUT component.

24. The system of claim 23, wherein the drive-side calibration is performed at a socket mounting pad of a loadboard for the DUT component.

25. The system of claim 15, further comprising:
means for performing compare-side calibration using a previously calibrated drive-side signal or an external pattern generator.

26. The system of claim 25, wherein the compare-side calibration is performed at a pogo pin or at a socket mounting pad of a loadboard for the DUT component.

27. The system of claim 15, further comprising:
means for moving a deskew calibration point from a pogo pin of a loadboard toward the DUT component.

28. The system of claim 15, further comprising:
means for moving a deskew calibration point from a socket mounting pad of a loadboard toward the DUT component.

29. A method for improved ATE (automatic test equipment) timing calibration at a DUT (device under test), comprising:

accessing a DUT component using an ATE component;
performing physical calibration on a first portion of signal pathways coupling the ATE component to the DUT component;
performing a simulation based calibration on a second portion of signal pathways coupling the ATE component to the DUT component; and
algebraically adding physical calibration results with simulation based calibration results to calibrate timing propagation delay between the ATE component and the DUT component.

30. A method for improved ATE (automatic test equipment) timing calibration at a DUT (device under test), comprising:

accessing a DUT component using an ATE component;
performing a simulation based calibration on signal pathways coupling the ATE component to the DUT component; and
using simulation based calibration results to calibrate timing propagation delay between the ATE component and the DUT component.

31. A method for improved ATE (automatic test equipment) timing calibration at a DUT (device under test), comprising:

accessing a DUT component using an ATE component;
performing physical calibration on a first portion of signal pathways coupling the ATE component to the DUT component, wherein interpolation/extrapolation is used to reduce a number of physical measurements required for covering a plurality of data rates and voltage ranges available to the DUT component;
performing a simulation based calibration on a second portion of signal pathways coupling the ATE component to the DUT component; and
combining calibration results with simulation based calibration results to calibrate timing propagation delay between the ATE component and the DUT component.

32. A method for improved ATE (automatic test equipment) timing calibration at a DUT (device under test), comprising:

accessing a DUT component using an ATE component;
performing physical calibration on a first portion of signal pathways coupling the ATE component to the DUT component and calibrating signal continuity of the DUT component utilizing signal reflection analysis;
performing a simulation based calibration on a second portion of signal pathways coupling the ATE component to the DUT component; and
combining calibration results with simulation based calibration results to calibrate timing propagation delay between the ATE component and the DUT component.

* * * * *